US011539347B1

(12) United States Patent
Chakraborty et al.

(10) Patent No.: US 11,539,347 B1
(45) Date of Patent: Dec. 27, 2022

(54) CURRENT-MODE FREQUENCY TRANSLATION CIRCUIT WITH PROGRAMMABLE GAIN

(71) Applicant: INTERNATIONAL BUSINESS MACHINES CORPORATION, Armonk, NY (US)

(72) Inventors: Sudipto Chakraborty, Plano, TX (US); John Francis Bulzacchelli, Somers, NY (US); David James Frank, Yorktown Heights, NY (US); Andrew D. Davies, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/467,059

(22) Filed: Sep. 3, 2021

(51) Int. Cl.
| | |
|---|---|
| H03D 99/00 | (2006.01) |
| H03H 11/04 | (2006.01) |
| H03D 7/12 | (2006.01) |
| H03H 11/24 | (2006.01) |
| H03H 11/28 | (2006.01) |

(52) U.S. Cl.
CPC ............ *H03H 11/04* (2013.01); *H03D 7/125* (2013.01); *H03H 11/24* (2013.01); *H03H 11/28* (2013.01)

(58) Field of Classification Search
CPC ........ H03H 11/04; H03H 11/24; H03H 11/28; H03D 7/125; H03D 2200/0066
See application file for complete search history.

(56) References Cited

U.S. PATENT DOCUMENTS

| | | | |
|---|---|---|---|
| 3,882,484 A * | 5/1975 | Brokaw | .................. H03M 1/40 341/138 |
| 8,543,055 B1 | 9/2013 | Cook et al. | |
| 9,374,053 B2 | 6/2016 | Jussila | |
| 9,543,995 B1 * | 1/2017 | Fabiano | .................... H04B 1/28 |
| 9,991,105 B2 | 6/2018 | Monroe et al. | |
| 10,275,556 B2 | 4/2019 | Sarpeshkar | |
| 2013/0039434 A1 * | 2/2013 | Oliaei | ................. H04L 25/0278 375/259 |
| 2017/0070252 A1 * | 3/2017 | Fong | .................... H03G 3/3052 |
| 2018/0145631 A1 | 5/2018 | Berkley et al. | |
| 2020/0411937 A1 | 12/2020 | Whittaker et al. | |

FOREIGN PATENT DOCUMENTS

WO      2020-055450 A1     3/2020

OTHER PUBLICATIONS

Bardin, J. C., et al., "A 28nm Bulk-CMOS 4-to-8GHz <2mW Cryogenic Pulse Modulator for Scalable Quantum Computing"; ISSCC (2019); 3 pgs.
Patra, B. et al., "A Scalable Cryo-CMOS 2-to-20GHz Digitally Intensive Controller for 4x32 Frequency Multiplexed Spin Qubits/Transmons in 22nm FinFET Technology for Quantum Computers"; ISSCC (2020); 3 pgs.

\* cited by examiner

Primary Examiner — Dinh T Le
(74) Attorney, Agent, or Firm — Intelletek Law Group, PLLC; Gabriel Daniel, Esq.

(57) ABSTRACT

A radio frequency (RF) transmission circuit includes an input stage, a current-mode mixer coupled to an output of the input stage, an attenuator coupled to an output of the current-mode mixer, and a matching network coupled to an output of the attenuator. The input stage, current-mode mixer, attenuator, and the matching network are configured in a series stack.

23 Claims, 7 Drawing Sheets

SIMULATION RESULTS

CURRENT-MODE FREQUENCY TRANSLATION CIRCUIT WITH PROGRAMMABLE GAIN

BACKGROUND

Technical Field

The present disclosure generally relates to radio frequency (RF) circuitry, and more particularly, to frequency translation circuits.

Background Information

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate. A quantum gate is a quantum circuit operating on a small number of qubits, which are building blocks of larger quantum circuits, like classical logic gates in conventional digital circuits. However, the quantum gate describes the transformation that one or more qubits will experience after the gate is applied on them, given their initial state. Various quantum phenomena, such as superposition and entanglement, do not have analogs in the world of classical computing and therefore may involve special structures, techniques, and materials.

Some quantum processors typically may be cooled to cryogenic temperatures to avoid thermal disturbances to their sensitive quantum states. Nonetheless, qubits may still suffer decoherence and gate errors. In this regard, techniques such as error correction may be used to better utilize the potential of quantum architectures. Such techniques typically involve control and readout of the quantum processor with room temperature electronics. The present inventors have observed that the utilization of room temperature electronics with circuitry at cryogenic temperatures may be subject to challenges for which improvements can be made.

SUMMARY

The following summarizes exemplary, non-limiting embodiments. According to one embodiment, a radio frequency (RF) transmission circuit includes an input stage, a current-mode mixer coupled to an output of the input stage, an attenuator coupled to an output of the current-mode mixer, and a matching network coupled to an output of the attenuator. The input stage, current-mode mixer, attenuator, and the matching network are configured in a series stack. By virtue of stacking, the same bias current can be used to power the input stage, the current-mode mixer, the attenuator, and the matching network. In this way current (and thus power consumption) is reduced.

In one embodiment, the attenuator is a variable attenuator.

In one embodiment, the attenuator is a current-mode attenuator.

In one embodiment, the matching network includes an inductive element coupled to an output of the attenuator.

In one embodiment, the inductive element of the matching network is configured to couple a plurality of transistors of the attenuator to a power supply with a negligible DC voltage drop between the power supply and the plurality of transistors of the attenuator.

In one embodiment, a same bias current is used in the input stage, the current-mode mixer, the attenuator, and the matching network. Since current reuse decreases the total current drawn from the power supply, circuit power efficiency is improved.

In one embodiment, the input stage includes a plurality of transistors that are configured to operate in a saturation region.

In one embodiment, the current-mode mixer includes a plurality of transistors that are configured to be alternately switched between a cutoff region and a triode region.

In one embodiment, the attenuator includes a plurality of transistors that are configured to operate in a saturation region.

By biasing the above-mentioned circuit blocks in an appropriate region of transistor operation, each of these circuit blocks provides better performance (e.g., higher gain, linearity, and/or lower noise), and efficiency.

In one embodiment, the current-mode mixer is configured to receive a local oscillator (LO) signal that is of rail-to-rail complementary metal oxide semiconductor (CMOS) levels.

In one embodiment, the attenuator is configured to receive control signals that are of rail-to-rail complementary metal oxide semiconductor (CMOS) levels.

In one embodiment, the input stage, current-mode mixer, attenuator, and the matching network include (e.g., are constructed of) metal oxide semiconductor (MOS) transistors.

In one embodiment, the input stage is configured to receive a voltage-mode output from a previous baseband filter stage.

In one embodiment, the input stage is configured to receive a current-mode output from a previous baseband filter stage.

In one embodiment, the attenuator is digitally programmable by attenuator settings configured to switch a variable number of parallel current-steering segments of the attenuator.

According to one embodiment, a method of frequency translation includes providing an input stage and coupling a current-mode mixer to an output of the input stage. A current-mode attenuator is coupled to an output of the current-mode mixer. A matching network having an inductive element is coupled to an output of the current-mode attenuator. The input stage, current-mode mixer, current-mode attenuator, and the matching network are configured in a series stack.

In one embodiment, a plurality of transistors of the current-mode attenuator are coupled by the matching network to a power supply with a negligible DC voltage drop between the power supply and the plurality of transistors of the current-mode attenuator.

In one embodiment, a same bias current is used (e.g., reused) in the input stage, the current-mode mixer, the current-mode attenuator, and the matching network.

In one embodiment, the plurality of transistors of the input stage are operated in a saturation region. A plurality of transistors of the current-mode mixer are alternately switched to be operated in a cutoff region and a triode region. A plurality of transistors of the attenuator are operated in the saturation region.

In one embodiment, the current-mode mixer receives a local oscillator (LO) signal that is of rail-to-rail complementary metal oxide semiconductor (CMOS) levels. The current-mode attenuator receives control signals that are of rail-to-rail complementary metal oxide semiconductor (CMOS) levels.

In one embodiment, the input stage receives a voltage-mode output from a previous baseband filter stage.

In one embodiment, the input stage receives a current-mode output from a previous baseband filter stage.

According to one embodiment, a frequency translation circuit includes an input stage, a current-mode mixer coupled to an output of the input stage, an attenuator coupled to an output of the current-mode mixer, and a matching network coupled to the mixer. The input stage, current-mode mixer, attenuator, and the matching network are configured in a series stack.

In one embodiment, the attenuator is a variable current-mode attenuator and the matching network includes an inductive element coupled to an output of the attenuator.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
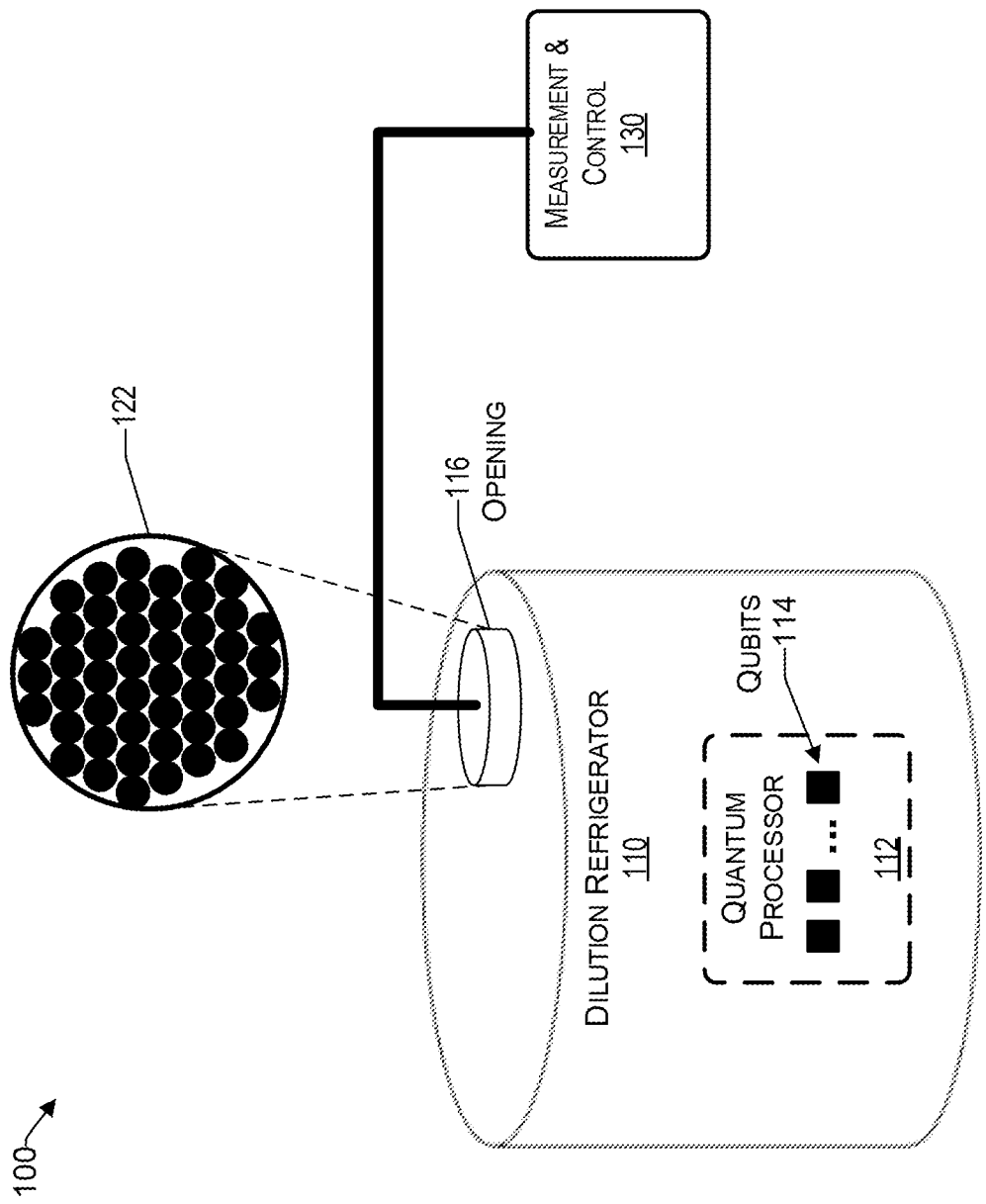
FIG. 1 is an example architecture of a quantum computing system, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In discussing the present technology, it may be helpful to describe various salient terms. As used herein a qubit represents a quantum bit, and a quantum gate is an operation performed on a qubit, such as controlling the super-positioning of two qubit states. A qubit represents a basic unit of quantum information, namely the quantum version of the classical binary bit physically realized with a two-state device.

A superconducting qubit may include a Josephson junction. A Josephson junction is formed by separating two superconducting metal layers by a thin insulating material. When the metal in the superconducting layers is caused to become superconducting—e.g., by reducing the temperature of the metal to a suitable cryogenic temperature—pairs of electrons can tunnel from one superconducting layer through the insulating layer to the other superconducting layer. The Josephson junction may be electrically coupled in parallel with one or more capacitive devices forming a nonlinear microwave oscillator. The oscillator may have a resonance/transition frequency determined by the value of the Josephson junction inductance and the parallel capacitance.

Although the terms first, second, third, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as "lossless," "superconductor," "superconducting," "absolute zero," which are intended to cover functionality that may not be exactly ideal but is within acceptable margins for a given application. For example, a certain level of loss or tolerance may be acceptable such that the resulting materials and structures may still be referred to by these "idealized" terms.

As noted previously, the utilization of room temperature electronics with circuitry at cryogenic temperatures may be subject to challenges for which improvements can be made. For example, moving support circuitry to the cryogenic environment, while providing various benefits, may involve substantial challenges that may not be evident at room temperature. Indeed, moving relevant support circuitry such as integrated control and readout circuits to the cryogenic environment makes it possible to connect these circuits to a quantum processor through superconducting interconnects but may include constraints of additional performance and very low power dissipation (e.g., <1 mW/qubit). The present disclosure generally relates to an arbitrary waveform generator that provides signals to superconducting devices, and more particularly, to providing frequency translation circuits that can interact with qubits in a cryogenic environment, where both the frequency translation circuits and the qubits are in the cryogenic environment. In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are used to block or reduce the noise without significant degradation of a signal-to-noise ratio. Alternatively, or in addition, a microwave signal (e.g., pulse) can be used to entangle one or more qubits. Much of the process is performed in a cold environment (e.g., in a cryogenic chamber), while the microwave signal of a qubit may be ultimately measured at room temperature. The amplitude and/or phase of the returned/output microwave signal carries information about the qubit state, such as whether the qubit has dephased to the ground or excited state. The microwave signal carrying the quantum information about the qubit state may be weak (e.g., on the order of a few microwave photons).

To measure this weak signal with room temperature electronics (i.e., outside the refrigerated environment), low-noise quantum-limited amplifiers (QLAs), such as Josephson amplifiers and travelling-wave parametric amplifiers (TWPAs), may be used as preamplifiers (i.e., first amplification stage) at the output of the quantum system to boost the quantum signal, while adding the minimum amount of noise as dictated by quantum mechanics, in order to maintain the signal to noise ratio of the output chain. In addition to Josephson amplifiers, certain Josephson microwave components that use Josephson amplifiers or Josephson mixers such as Josephson circulators, Josephson isolators, and Josephson mixers can be used in scalable quantum processors.

The information processed by qubits may be carried or transmitted in the form of microwave signals/photons in the range of microwave frequencies. The microwave frequency of a qubit output is determined by the resonance frequency of the qubit. The microwave signals are captured, processed, and analyzed to determine the quantum information encoded therein. A readout circuit is a circuit coupled with the qubit to capture, read, and measure the quantum state of the qubit. An output of the readout circuit comprises information usable by a quantum processor to perform computations.

The ability to include more qubits is salient to being able to realize the potential of quantum computers. Generally, performance may increase as temperature is lowered, for example by reducing the residual thermally-excited state qubit population and decreasing the thermal broadening of the qubit transition frequencies.

The inventors have recognized that to increase the computational power and reliability of a quantum computer, improvements can be made. First is the qubit count itself. The more qubits in a quantum processor, the more states can in principle be manipulated. Second is lowering error rates, which is relevant to manipulate qubit states accurately and perform sequential operations that provide consistent and more reliable results.

For quantum computing using qubits to be reliable, it is desired that the readout circuitry associated with the qubits, and other parts of the quantum processor, not alter the energy states of the qubit, such as by injecting or dissipating energy, in any significant manner or influence the relative phase between the states of the qubit. This operational constraint on a circuit that operates with quantum information implicates special considerations in fabricating semiconductor and superconducting structures that are used in such circuits.

In one aspect, the teachings herein involve the inventors' insight that directly applying conventional integrated circuit techniques for interacting with computing elements to superconducting quantum circuits may not be effective because of the unique challenges presented by quantum circuits that are not presented in classical computing architectures. Accordingly, embodiments of the present disclosure are further based on recognition that issues unique to quantum circuits have been taken into consideration when evaluating applicability of conventional integrated circuit techniques to building superconducting quantum circuits, and, in particular, to electing methods and architectures used for interacting efficiently with qubits that facilitates current reuse (e.g., for reduced power dissipation) and low distortion in qubit support circuitry that is in harmony with the requirements of cryogenic waveform generation.

In one aspect, the radio frequency (RF) transmitter circuits that support the interaction with qubits in a qubit array discussed herein provide current-mode signal processing, which facilitates seamless addition and subtraction of various current-mode signal processing elements to synthesize a variety of low distortion analog signal processing. More specifically, frequency translation circuits are discussed herein that involve mixers and attenuators, which are salient components of exemplary architecture. In one embodiment, the frequency translation circuit includes circuit blocks that can operate with complementary metal oxide semiconductor (CMOS) levels (i.e., rail-to-rail) local oscillator (LO) and attenuator control signals, which can be generated with power-efficient CMOS inverters. Superior phase noise is achieved with a large-signal square wave LO drive. Input to this switching core may be a baseband current. The output current can be attenuated using digital control and shared with the switching core itself to achieve low power consumption.

Example Architecture

FIG. 1 is an example architecture 100 of a quantum computing system, consistent with an illustrative embodiment. The architecture 100 includes a quantum processor 112 comprising a plurality of qubits 114. The quantum processor 112 is located in a refrigeration unit 110, which may be a dilution refrigerator. A dilution refrigerator is a cryogenic device that provides continuous cooling to very low temperatures, typically 10 mK. Most of the physical volume of the architecture 100 is due to the large size of the refrigeration unit 110. To reach the near-absolute zero temperatures at which the system operates, the refrigeration unit 110 may use liquid helium as a coolant.

There is a measurement and control unit 130 that is outside of the refrigeration unit 110. The measurement and control unit 130 is able to communicate with the quantum processor through an opening 116, sometimes referred to as a bulkhead of the dilution refrigerator 110, which also forms a hermetic seal separating the ambient atmospheric pressure from the vacuum pressure of the cryostat under operation. A practical challenge in known refrigeration devices that house qubits 114 is that the number of qubits that can be accommodated in the refrigeration unit is limited due to the number of wires 122 between the measurement and control unit 130 and the qubits 114 measured/controlled thereby as well as the power consumption within the cryogenic environment of the refrigeration unit 110.

As the number of qubits 114 increases, for example to hundreds, thousands, or more, the opening 116 may not be large enough to accommodate all the lines 122 supporting the quantum processor 112 in the dilution refrigerator 110, making the number of lines (e.g., wires) 122 a salient consideration in the architectures discussed herein. Stated differently, access to the vacuum environment of the dilution refrigerator 110 is limited to the number of connectors that can fit through the bulkhead opening 116. In one aspect, to reduce the number of wires 122 between the room-temperature and cryogenic environments, the frequency translation circuits discussed herein are placed at a low temperature stage (such as at T=4K) of the refrigeration unit 110. Since the heat lift capacity of the low temperature stage is limited, minimizing the power consumption of such circuits is a salient consideration. For a highly scaled system (e.g., with >1000 qubits 114), the power consumption of each RF transmitter would preferably be less than 1 mW, which is presently not accommodated by known systems.

Example Radio Frequency Building Block

Figure 2:
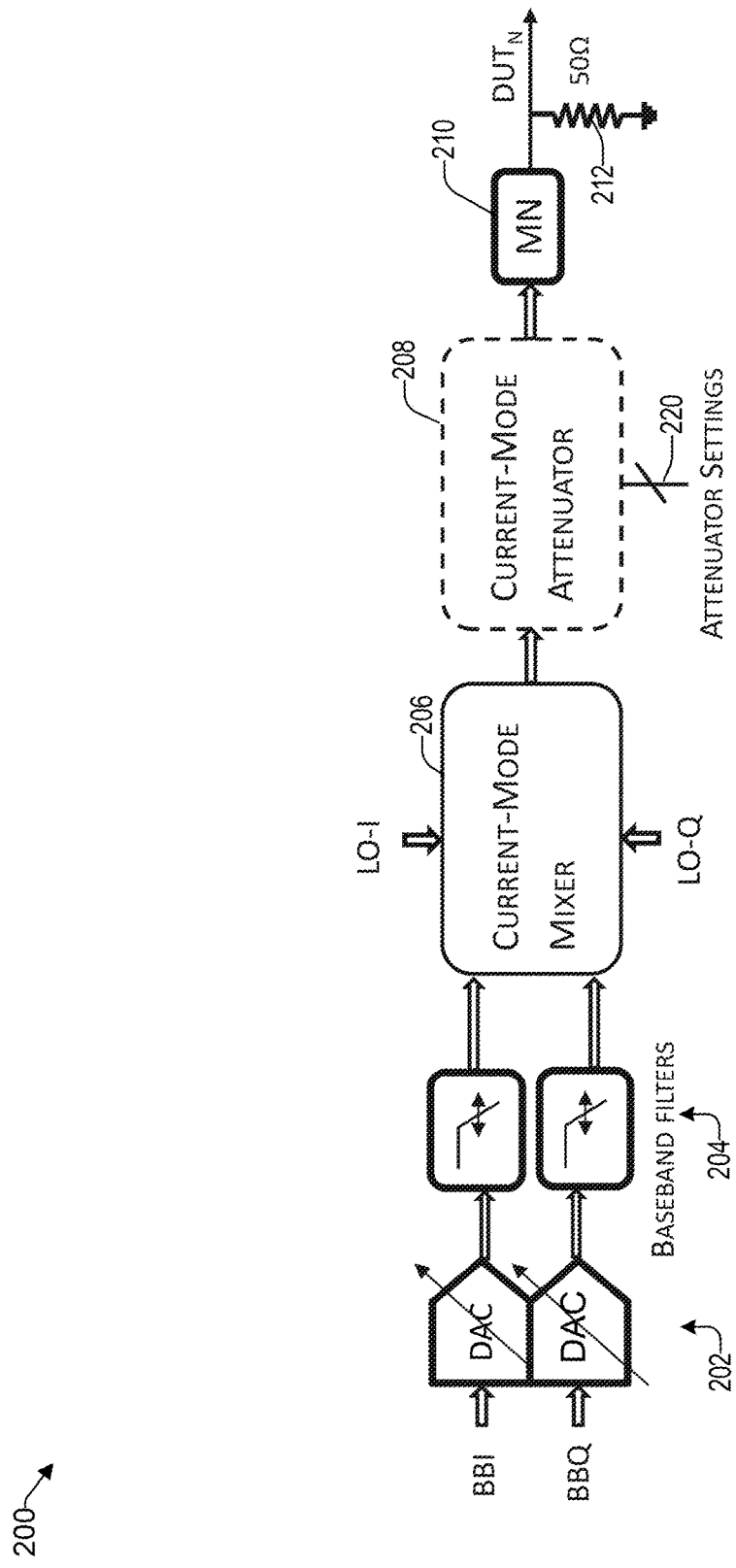
FIG. 2 is a block diagram of an example frequency translation circuit, consistent with an illustrative embodiment.

One building block in arbitrary waveform generator circuitry used in the interaction with qubits includes an upconverting mixer, which translates baseband signals, such as the in-phase (I) and quadrature (Q) baseband signals generated by a pair of DACs, up to the desired carrier frequency. In this regard, FIG. 2 provides a block diagram of an exemplary radio frequency (RF) transmitter chain 200 according to the disclosure. As indicated in the figure, the stages of transmitter chain 200 are preferably implemented as current-mode circuits, in which the input and output signals are represented as currents instead of voltages. The use of current-mode circuits allows one to avoid the drawbacks of voltage-mode circuits, which place high dynamic range requirements at the block interfaces that often lead to nonlinear behavior and the generation of undesired distortion products. Such distortion products may adversely affect the integrity of qubits. The transmitter chain 200 includes digital to analog converters (DACs) 202 for the I and Q baseband signals. The output currents of the DAC stages 202 are passed to a baseband (e.g., low-pass) filter stage 204 to eliminate the out-of-band components. The outputs of the baseband filter stage 204 are provided to a mixer 206, which preferably features current-mode inputs. The current-mode mixer 206 is operative to receive the filtered baseband input signals and mix them with the corresponding in-phase and quadrature local oscillator (LO) signals around which the up-conversion is to occur.

For a low power transmitter, the output current of the current-mode mixer 206 may be directly applied to the load impedance 212 (e.g., 50 ohm) through an appropriate matching network (MN) 210. The elimination of a separate driver stage saves power and reduces signal distortion. Some provision for amplitude control is also included in many RF transmitter systems.

An effective technique for accomplishing amplitude control is to add an RF attenuator 208 at the output of the mixer 206, as a nearly constant signal to noise ratio (SNR) can then be maintained over a wide range of output amplitudes at the output of the matching network 210. The attenuator stage 208 may also provide a blanking mode, which shuts down the transmitter output (preferably with as little output noise as possible). For example, the blanking mode ensures that the transmitter does not disturb other elements in the system when it is not being used to generate RF output signals. Disadvantages of voltage-mode attenuators include signal loss, impedance restrictions, and moderate-to-high latency in switching between different attenuation values. The current-mode attenuator 208 may have an advantage of avoiding such deficiencies. For instance, the use of the current-mode attenuator 208 allows the output amplitude to be varied rapidly with little degradation of SNR. When all attenuator segments are switched OFF in a blanking mode, no current is passed to the matching network 210, and a very low output noise is provided.

The present inventors have observed that power-efficient RF transmitter circuits may be desirable for quantum computing systems, particularly when operated in a cryogenic environment. In such systems, RF transmitter chains can be used, for example, as arbitrary waveform generators for the RF pulses that control the qubits. High linearity is desired for such circuits to achieve low signal distortion. The blanking mode of an attenuator is particularly important in such applications to suppress output noise that can cause qubit decoherence.

In various applications, the frequency translation circuit 200 can be used as an RF transmitter. In the example of FIG. 2, both the mixer 206 and the attenuator 208 are implemented as current-mode circuits. The smaller voltage swings at the interfaces between blocks 206 and 208 reduce nonlinear effects. Accordingly, less distortion, such as harmonic distortion or intermodulation distortion, is generated. Another advantage of current-mode circuits discussed herein is that they facilitate current reuse, in which the bias and signal currents of one stage are shared with another stage (i.e., by stacking the circuit stages). Since current reuse decreases the total current drawn from the power supply, circuit power efficiency is improved. In one aspect, the current-mode attenuator 208 can also allow rapid switching between different attenuation values 220.

While the current-mode circuits may be power-efficient due to current reuse, the demands that they place on the circuits driving or controlling them may involve power penalties that may impact the power efficiency of the overall transmitter system. For instance, the current-mode mixer 206 may involve local oscillator (LO) drive waveforms for the I and Q signals with custom voltage levels that may be used to maintain optimal (e.g., near-optimal) performance in the current-mode mixer 206. Such considerations may be involved because optimum performance is obtained when key transistors of the circuit of the current-mode mixer 206 and/or current-mode attenuator 208 are operated in specific operating regions such as saturation, triode, etc., to facilitate a more efficient operation. For example, high performance may be obtained when the input devices operate in saturation and offer high output impedance, the switching transistors of the mixer operate between triode and cut-off regions and offer low ON resistance, and the attenuator transistors operate in saturation and offer high output impedance.

The current-mode attenuator 208 may similarly place voltage level requirements on its control signals. While custom drive levels may be generated with a current-mode logic (CML) buffer or a buffer with bias resistors, the power efficiency of such buffers is relatively poor compared to a simple CMOS inverter generating rail-to-rail voltage levels. In addition, the low swing of a CIVIL-level LO signal may increase out-of-band phase noise at the mixer 206 output. In one embodiment, to improve the power efficiency of the frequency translation circuit 200, the topologies for current-mode mixer 206 and attenuator 208 facilitate current reuse, while achieving high performance when driven or controlled by CMOS (rail-to-rail) levels.

Example Block Diagrams

Figure 3:
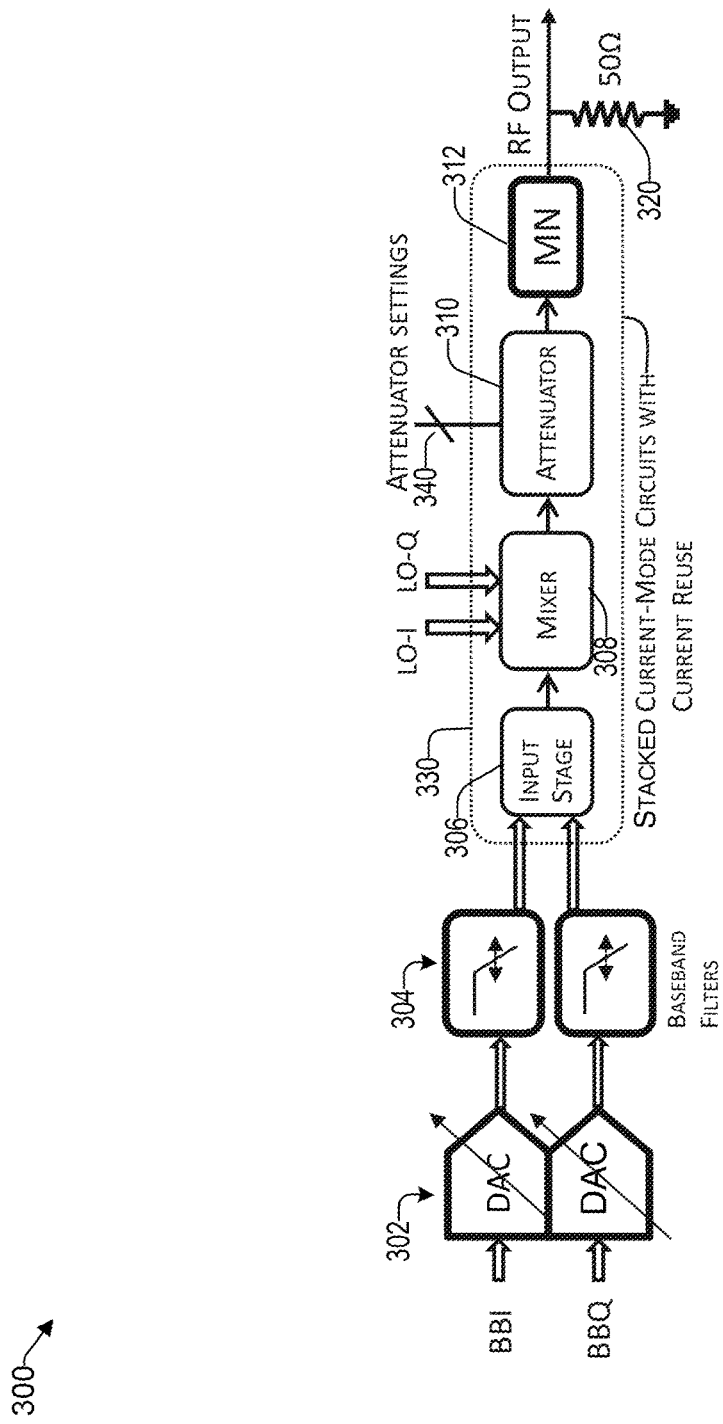
FIG. 3 is a block diagram of a frequency translation circuit having a stacked circuit architecture, consistent with an illustrative embodiment.

Reference now is made to FIG. 3, which is a block diagram of an exemplary frequency translation circuit 300 having a stacked circuit architecture, consistent with an illustrative embodiment. The frequency translation circuit 300 includes a DAC stage 302 coupled to a baseband filter stage 304 that is operative to provide low pass filtration of the I and Q baseband signals. The filtered baseband I and Q signals are provided to a current-mode circuit block 330 featuring current reuse. The current-mode circuit block 330 includes an input stage 306 operative to receive in-phase I and quadrature Q baseband signals from the baseband filter stage 304. There is a current-mode mixer 308 coupled to the input stage 306 that is operated to mix the I and Q baseband signals provided by the input stage with local oscillator I and Q signals. An (e.g., variable) attenuator 310 is coupled to the mixer 308. A matching network (MN) 312 is coupled to the attenuator 310. The input stage 306, mixer 308, attenuator 310, and the matching network 312 are configured in a series stack.

Accordingly, the current-mode circuit block 330 operates as a power-efficient current-mode mixing (i.e., frequency translation) system with variable gain control that is implemented as a series stack of an input stage 306, a mixer 308, a variable attenuator 310, and a matching network (MN) 312 that may include an inductive element. Power dissipation is reduced (e.g., minimized) through current reuse, as all of these circuit components of the current-mode circuit block 330 share the same bias current. The input stage 306 receives an output from a previous stage, represented in FIG. 3 by way of example as a baseband filter, and converts the received signal to signal currents that flow through the series stack.

In one embodiment, the input stage 306 may receive a current-mode output from the previous stage, wherein the input stage can be realized as a type of current mirror. In other embodiments, the input stage may receive a voltage-mode output from the previous stage, in which case the input stage can be realized as a type of transconductor. The currents from the input stage 306 then pass through the rest of the series stack (i.e., mixer 308, variable attenuator 310, and matching network 312). In one embodiment, the mixer 308 is driven by a high frequency digital switching waveform from a local oscillator (LO) clock buffer that generates CMOS-level rail-to-rail signals. As used herein, a "high frequency" refers to frequencies above 1 GHz. However, the teachings herein are not limited by frequency ranges. Because no custom drive levels need to be generated by a circuit, such as a current-mode logic (CML) buffer or a buffer with bias resistors, the buffers of the LO clock path can be simple CMOS inverters, which are power-efficient. For example, CMOS inverters provide fast switching and offer signal swing at the output that are limited by supply rail. The power consumption of such a driver circuit is given by $CL*VDDA^2*f$, where CL is the load capacitance, VDD is the supply voltage and f is the switching frequency. As the technology nodes are scaled, device capacitances decrease, supply voltage gets reduced, and the NMOS and PMOS devices offer equal drive strength, a driver chain employing CMOS inverters becomes very power efficient.

In one embodiment, the current-mode outputs of the mixer 308 are combined to provide a single sideband signal, which is passed to the current-mode attenuator 310. For example, by way of digital logic, a portion (e.g., half) of the stack can be disabled by the attenuator settings 340. In some applications, double sideband signaling can also be used.

The attenuator 310 can use a plurality of digitally controlled current steering stages to implement gain changes with low latency (e.g., less than 10 ns). In one embodiment, CMOS-level rail-to-rail signals are used to control the attenuator settings 340. Switching OFF all of the attenuator 310 stages establishes a zero state in output signaling (i.e., a blanking mode), which suppresses output noise. In one embodiment, the attenuator 310 provides full digital programmability based on switching a variable number of parallel current-steering segments, which can be controlled by the attenuator settings 340. Both the LO drive waveforms provided to the mixer 308 as well as the attenuator switch control signals 340 can use rail-to-rail levels, which can be generated, for example, with power-efficient CMOS inverters.

An advantage of the architecture of FIG. 3 is how the transistors in the series stack of the current-mode circuit block 330 can be biased in the desired operating regions without applying custom drive levels to their gates. As mentioned above, buffer designs that can generate custom drive levels typically suffer from relatively low power efficiency, which is avoided by the architecture of FIG. 3. First, the output of the attenuator 310 is coupled to a MN 312 that may include an inductive element (e.g., inductor or transformer) providing near zero DC drop from the power supply. In one embodiment, CMOS inverters operating from the same power supply (e.g., to which the inductive matching network at the output is coupled) drive the gates of the transistors in the attenuator 310, and the drains of these transistors are connected to the MN 312. The transistors of the attenuator 310 will be biased with their gate-to-drain voltages close to zero when the CMOS inverters produce a logic high. It is noted that, in general, the use of a single power supply is beneficial for reducing system costs and simplifying chip layout. Even with moderate signal swings (e.g., 100 mV), the gate-to-drain voltages of the attenuator 310 transistors remain below a transistor threshold voltage, so the transistors operate in saturation, providing high output impedance, high gain, and good linearity. By way of example and not by way of limitation, attenuator implementations can operate with 50 to 60 dBc signal to distortion ratios.

The input stage 306 may receive outputs from the previous stage (e.g., baseband filter stage 304) that have a relatively low common-mode voltage (e.g., a gate-to-source voltage above ground or slightly higher), so there is sufficient headroom available in the series stack of the current-mode circuit block 330 to keep the input stage 306 transistors in saturation. Therefore, accurate baseband currents are generated. In one embodiment, only the transistors in the mixer 308 do not operate in saturation. These transistors of the mixer 308 are switched (at the LO frequency) between the triode and cutoff regions. Triode-region operation of the mixer transistors provides low flicker noise.

Example Schematic Diagrams

Figure 4:
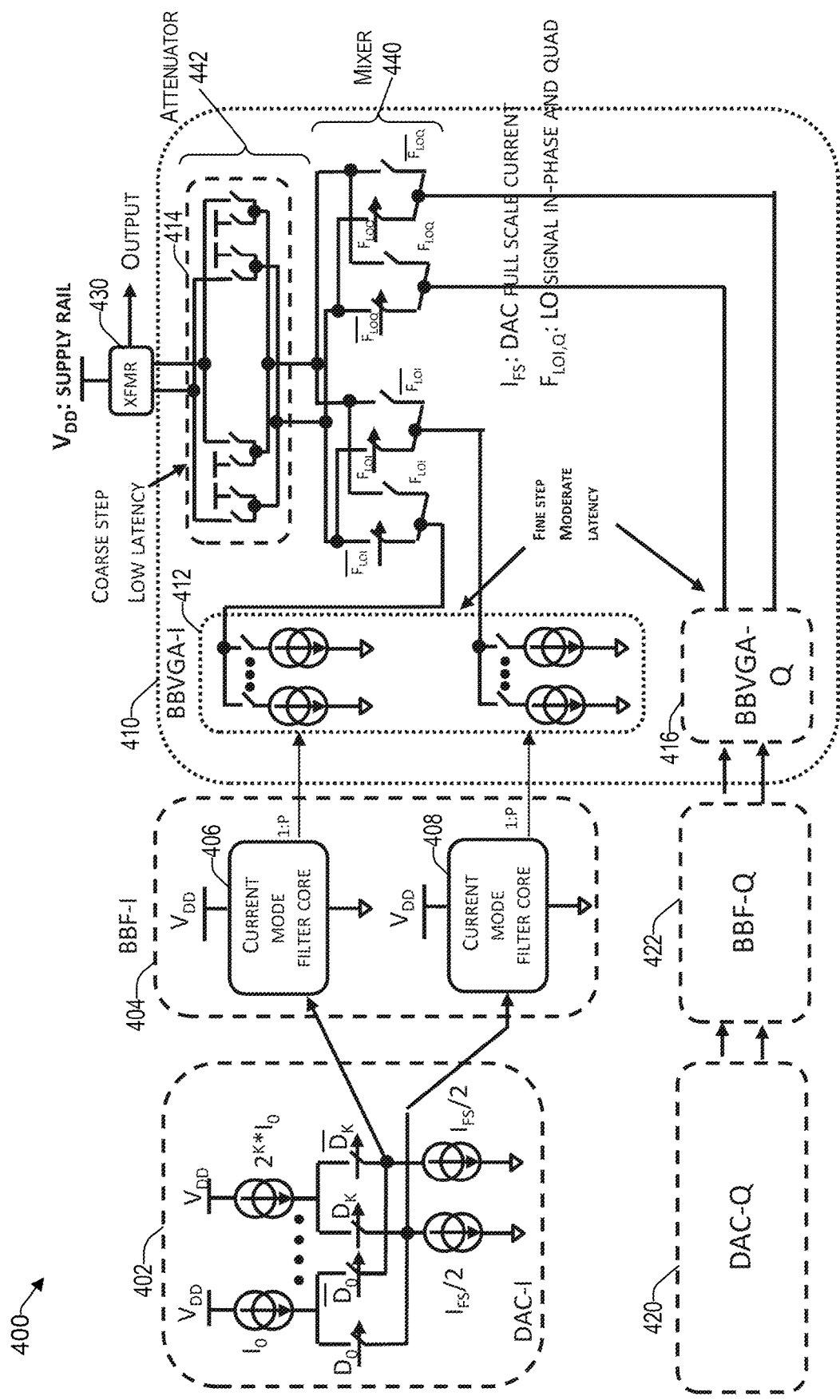
FIG. 4 is a transistor level schematic of a frequency translation circuit having a stacked circuit architecture, consistent with an illustrative embodiment.

Reference now is made to FIG. 4, which is an exemplary transistor level schematic of a frequency translation circuit 400 having a stacked circuit architecture, consistent with an illustrative embodiment. FIG. 4 illustrates an in-phase DAC stage circuit 402 coupled to an in-phase baseband filter stage 404, comprising a first current-mode filter core 406 and a second current-mode filter core 408, to accommodate differential signaling. The corresponding circuitry for the quadrature DAC stage 420 and quadrature filter stage 422 are similar in structure and are therefore not repeated for simplicity and to avoid clutter. The transformer block 430 can be used to achieve three functions related to the signal generator: (i) provide impedance conversion between the waveform generator and the load, thereby providing voltage or current gain (but not both), (ii) provide differential to single ended conversion, and/or (iii) provide direct current (DC) isolation between the signal generator and the load. Further, while a differential architecture is depicted in the example of FIG. 4 to provide better signal integrity, single ended signaling is within the scope of the present disclosure.

The current-mode circuit block 410 includes an input stage circuit 412 for the in-phase path and an input stage circuit 416 for the quadrature path, operative to receive in-phase I and quadrature Q baseband signals from the baseband filter stage 404/422, respectively.

As illustrated in the example of FIG. 4, the components of the current-mode circuit block 410 may be implemented in a circuit stack. More specifically, the input stage 412 is in series with the mixer circuit 440, which in turn is in series with the attenuator circuit 442, which is in series with the transformer (matching network) 430. Current switching in the attenuator circuit 442 allows rapid changes in gain (and therefore output amplitude of transformer 430). In one embodiment, the gain steps provided by attenuator circuit 442 are fairly coarse. In this regard, a fine gain adjustment for the baseband current is provided by the input stage (e.g., by adding a variable ratio current mirror), which would provide finer gain steps, which may be in a trade-off of slower switching speed. Near constant and optimum current density can be maintained in each attenuator 442 segment, so low distortion performance is achieved over wide range of output amplitudes. As used herein a segment means a quad comprising four transistors: $\{M_{AP1A}, M_{AN1A}, M_{AN1B}, \text{and } M_{AP1B}\}$. The biasing consideration of each of these components is discussed in more detail below.

Figure 5:
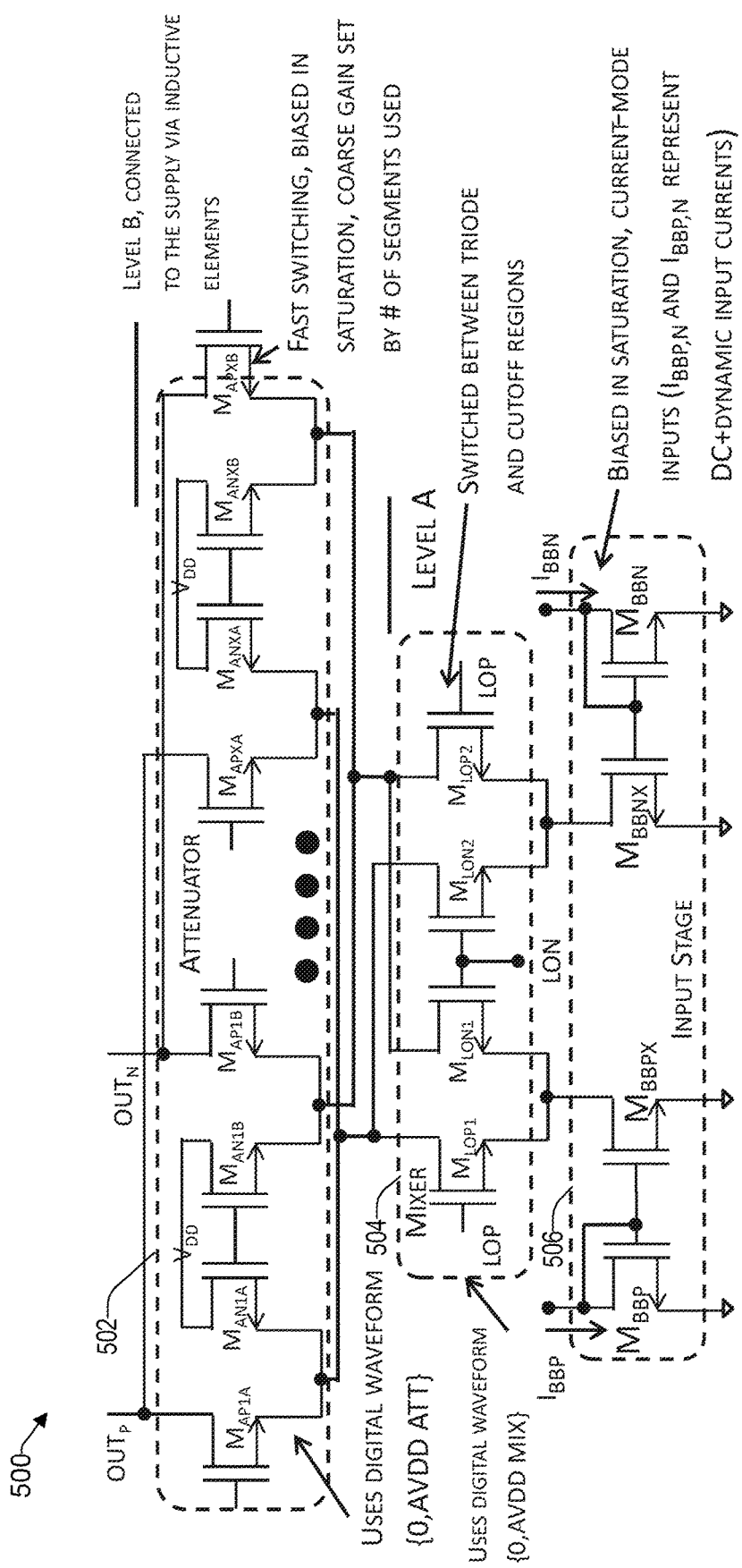
FIG. 5 is a transistor level schematic of a current-mode circuit block implemented in a series stack having a current-mode input, consistent with an illustrative embodiment.

FIG. 5 is an exemplary transistor level schematic of a current-mode circuit block 500 implemented in a series stack having a current-mode input, consistent with an illustrative embodiment. The current-mode circuit block 500 includes a current-mode input stage circuit 506 (operating as a current mirror), sometimes referred to herein as a base level. There is a mixer circuit 504 stacked in series on top of the input stage circuit 506, sometimes referred to herein as level A. There is an attenuator circuit 502 stacked in series on top of the mixer circuit 504, sometimes referred to herein as level B. By virtue of the stacked configuration of FIG. 5, each of these circuit blocks can be biased in an appropriate region of transistor operation for maximizing signal to distortion ratio per unit power consumption metric. For example, the drains of the transistors of the attenuator circuit 502 (level B) are connected to a first supply level (e.g., VDD) through a matching network with inductive elements (such as transformer 430 shown in FIG. 4) having a negligible (e.g., 10 mV-20 mV) DC drop. Accordingly, the transistors of the attenuator circuit 502 operate in saturation. It should be noted that the transistors of the attenuator circuit 502 operate in saturation when they are active (i.e., "ON"). When a segment is shut down (e.g., for reduced signal level), these transistors are turned OFF and placed in cutoff mode.

As to the mixer circuit 504, the drain voltages of the mixer transistors (level A) are biased one gate-to-source voltage (VGS) below ground. The transistors of the mixer circuit 504 are switched between cutoff and triode regions (assuming the LO signals are driven to CMOS rail-to-rail levels), thereby providing a low flicker (1/f) noise. As to the input stage 506 (i.e., at base level), a common-mode voltage at the gate of the input stage 506 is only about one VGS above ground. Accordingly, the transistors of the input stage 506 operate in saturation with adequate headroom, which can be satisfied with the condition that the voltage difference between gate and drain ($V_{GD}$) is less than the threshold voltage ($V_T$) of the transistor. Example values would be $V_T$=300 mV, and $V_{GS}$=350 mV, and $V_{DS}$=200 mV, leading to $V_{GD}$=150 mV (with adequate supply voltage). Since $V_{GD}$ (150 mV) is less than $V_T$ (300 mV), the transistors of input stage 506 would be in saturation.

Figure 6:
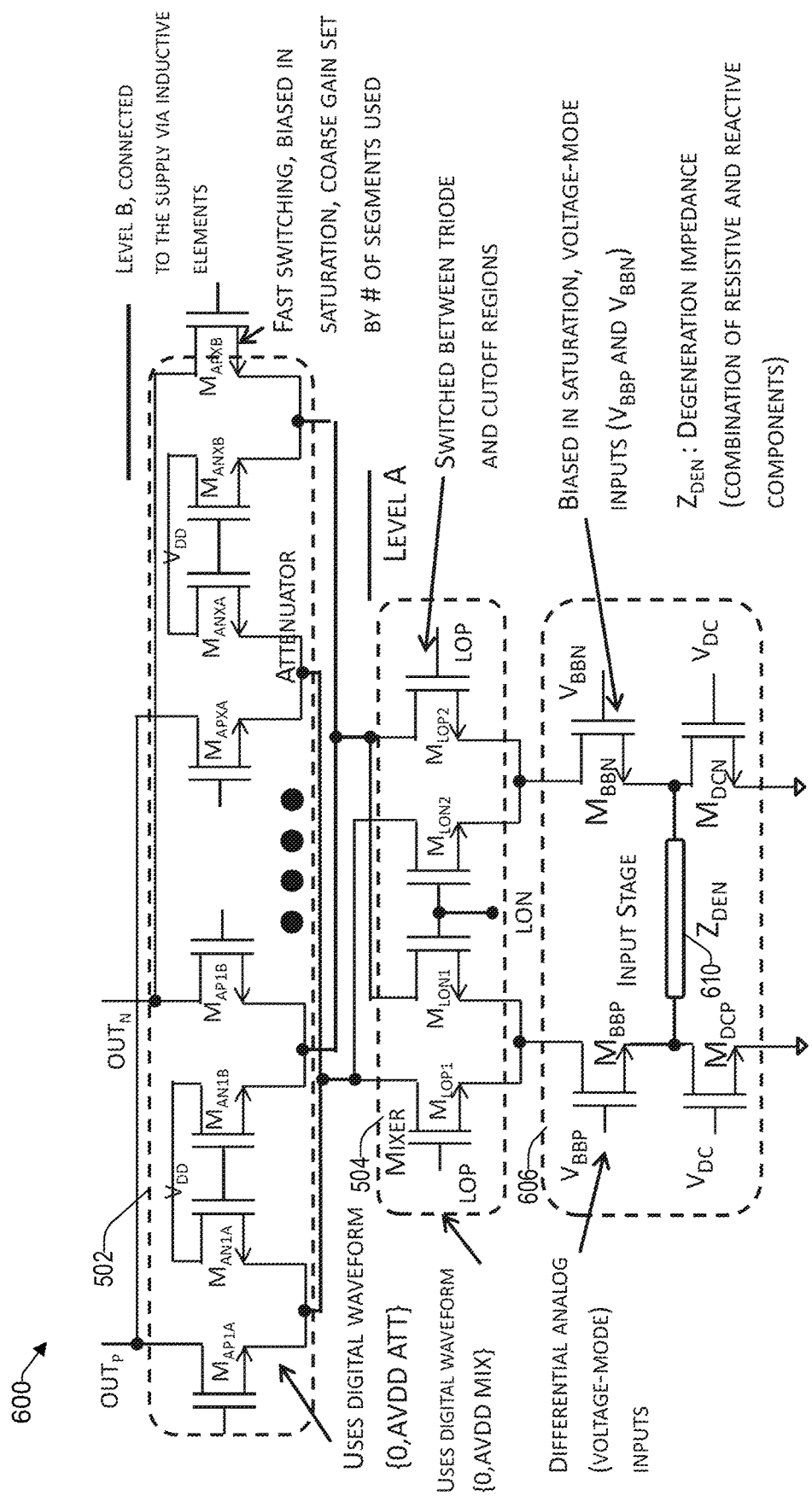
FIG. 6 is a transistor level schematic of a current-mode circuit block implemented in a series stack having a voltage-mode input, consistent with an illustrative embodiment.

Reference now is made to FIG. 6, which is an exemplary transistor level schematic of a current-mode circuit block 600 implemented in a series stack having a voltage-mode input, consistent with an illustrative embodiment. The attenuator circuit 502 in series with the mixer 504 is substantially similar to the ones of FIG. 5 and therefore not discussed here for brevity. The salient difference emphasized in FIG. 6 is that the input stage 606 is able to accommodate voltage-mode inputs. In various embodiments, the voltage input can be single ended or differential. In differential mode, in one embodiment, there is an impedance unit ZDEN 610 comprising resistive and reactive components between the transistors of the first voltage input and the second voltage input of the differential analog inputs of the input stage circuit 606. The input stage 606 operates as a transconductor, and a desired value of transconductance can be obtained by setting the impedance of ZDEN 610 appropriately. The transistors of the input stage 606 are biased in saturation.

The teachings herein based on a current-mode circuit block provide various benefits over known architectures. In one aspect, there is an improved power efficiency through current reuse. Referring back to FIG. 5, the input transistors of the input stage circuit 506 (e.g., current mirror) and output transistors of the attenuator circuit 502 operate in saturation, which maintains high performance in terms of gain, waveform accuracy, distortion, and dynamic range. In one embodiment, the teachings herein facilitate further stacking if multiple stages of mixer are used to accommodate a particular architecture.

Example Simulation Results

Figure 7A:
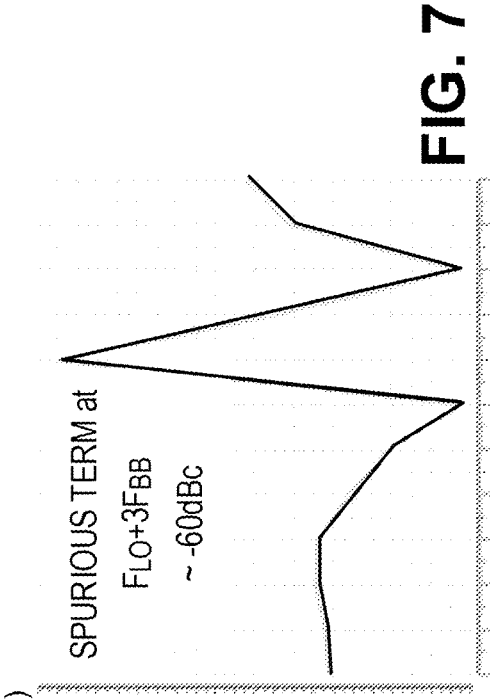
FIG. 7A shows the output amplitude of a fundamental signal as the attenuator steps are varied, consistent with an illustrative embodiment.

FIGS. 7A to 7D provide exemplary plots describing different aspects of simulation performance of the frequency translation circuit of FIG. 5, consistent with an illustrative embodiment. More specifically, FIG. 7A shows the output amplitude of a fundamental signal as the attenuator steps are varied, consistent with an illustrative embodiment. In FIG. 7A: X axis=attenuator code, Y axis is output power (dBm); in FIG. 7B: X axis=attenuator code, Y axis is spur level (dBc); in FIG. 7C: X axis=attenuator code, Y axis is LO suppression (dBc); and in FIG. 7D: X axis=frequency (GHz), Y axis is relative magnitude (dB). In the present example, there are 12 steps (individual quads of transistors) that can be turned ON by way of attenuator settings. The X axis in FIG. 7A provides the number of units that are turned ON. FIG. 7A illustrates that as the number of segments are turned ON, the output power increases. In one embodiment, the selection is performed using digital codes that control the gate terminals of the attenuator quads (e.g., via attenuator settings 340 in FIG. 3). FIG. 7A shows an overall 20 dB possible gain variation that can be accomplished by the attenuator transistors in a realistic scenario.

Figure 7B:
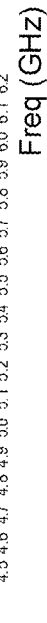
FIG. 7B is a graph showing a level of a spurious term caused by a third-order nonlinearity with respect to a number of attenuator units that are turned ON, consistent with an illustrative embodiment.

FIG. 7B is a graph showing a level of a spurious term caused by a third-order nonlinearity with respect to a number of units that are turned ON, consistent with an illustrative embodiment. For a given fundamental frequency of the baseband signal ($F_{BB}$) and local oscillator (LO) frequency of $F_{LO}$ (i.e., local oscillator (LO) providing a frequency of $F_{LO}$) involved in a single sideband mixer (e.g., quadrature forms of both signals are multiplied and added) the desired term can be represented by $F_{LO}-F_{BB}$ and the corresponding image term can be represented by $F_{LO}+F_{BB}$. This image term at $F_{LO}+F_{BB}$ will be cancelled effectively if the circuit components are well matched. However, due to a third-order nonlinearity, a spur may be generated at a frequency of $F_{LO}+3F_{BB}$, and the amplitude of this spur is an indicator of the system's linearity. As the attenuator provides a constant signal to distortion ratio, FIG. 7B confirms that the level of the spur at $F_{LO}+3F_{BB}$ is held at a relatively constant difference from the fundamental output (located at $F_{LO}-F_{BB}$) as the attenuator steps are increased (provided in X axis). This constant level is at about −60 dBc; that is, the distortion is lower than the fundamental component by 60 dB, which is the equivalent of a 10 bit level DAC performance.

Figure 7C:
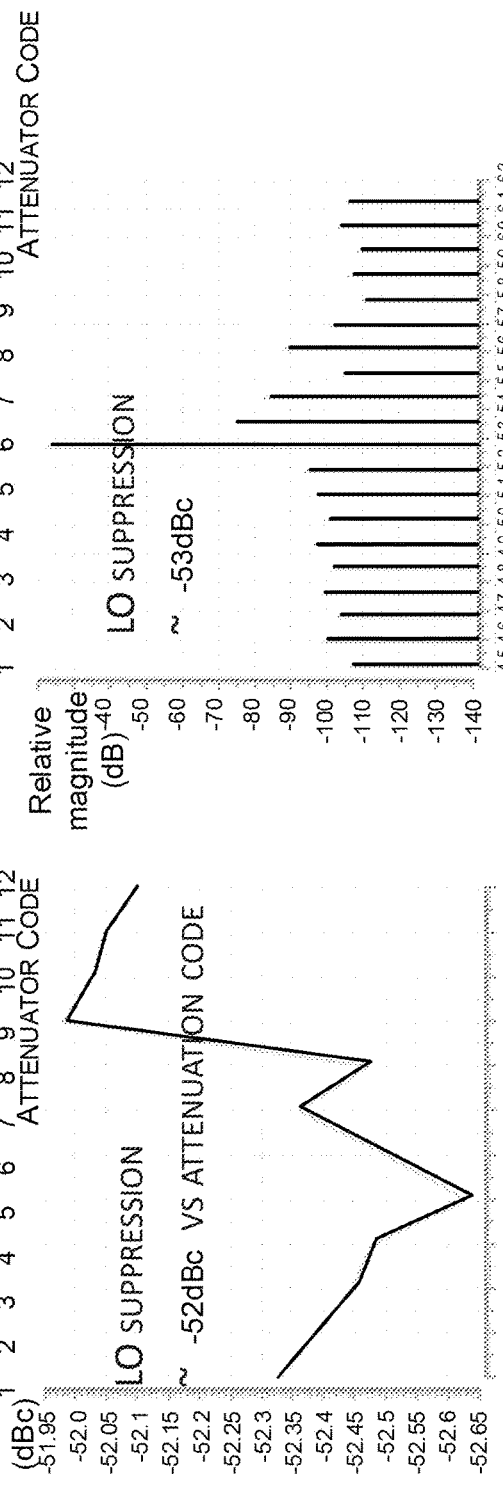
FIG. 7C is a graph showing the level of local oscillator suppression with respect to a number of attenuator units that are turned ON, consistent with an illustrative embodiment.

FIG. 7C is a graph showing the level of LO suppression with respect to a number of units that are turned ON, consistent with an illustrative embodiment. In an ideal mixing operation with ideal components, an LO frequency component will not be present in the output spectrum of the upconverted signal. However, due to finite mismatch between transistors and finite impedance effects, some residual levels are typically present. An on-chip calibration is performed to minimize this level. For example, the targeted signal component can be detected using an on-chip detector and a control signal can adjust the required biasing/headroom needed in the transistor stack. FIG. 7C illustrates that the LO leakage level remains at a relatively constant difference (about −52 dBc) from the fundamental signal as the attenuator steps are changed.

Figure 7D:
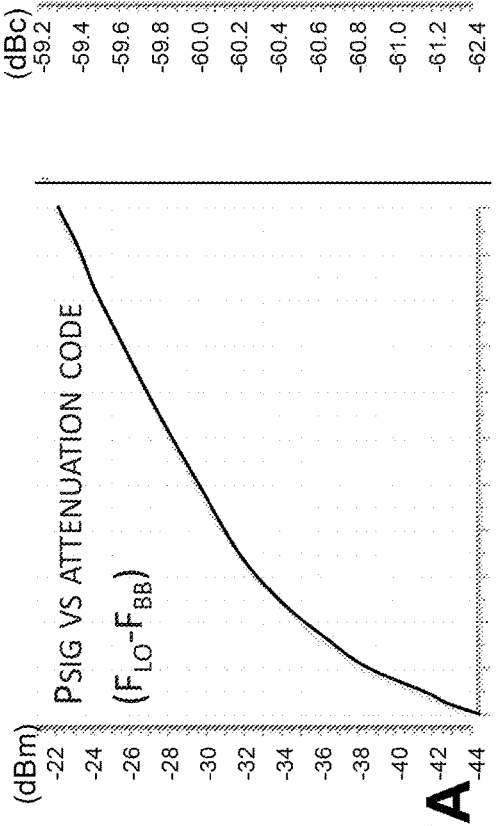
FIG. 7D shows a graph of an output spectrum with the fundamental term and the local oscillator suppression term, consistent with an illustrative embodiment.

FIG. 7D shows a graph of an output spectrum with the fundamental term and the LO suppression term, consistent with an illustrative embodiment. The simulations are performed with a baseband signal of 85 MHz and LO frequency of 5355 MHz. The graph shows that the LO suppression (leakage) term at 5355 MHz is about 53 dB below the desired fundamental term at $F_{LO}-F_{BB}$=5270 MHz.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently. For example, any signal discussed herein may be scaled, buffered, scaled and buffered, converted to another state (e.g., voltage, current, charge, time, etc.,), or converted to another state (e.g., from HIGH to LOW and LOW to HIGH) without materially changing the underlying control method.

While NFETS are illustrated and/or discussed in some of the examples herein, these transistors were provided by way of example only, and not by way of limitation. It will be understood that these circuits can be readily configured to use PFETS instead of or in addition to the NFETS. It will also be understood, based on the concepts disclosed herein, that other types of insulated-gate field effect transistors (IGFET) with complementary logic may be used as well. For example, any FETS from columns III-V of the periodic table, including carbon nanotube FETS could be used as well to implement the structures described herein. In some embodiments, bipolar transistors (e.g., PNP or NPN), and/or BiCMOS can be used instead of MOS transistors.

Aspects of the present disclosure are described herein with reference to a flowchart illustration and/or block diagram of a method, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A radio frequency (RF) transmission circuit comprising:
   an input stage;
   a current-mode mixer coupled to an output of the input stage;
   an attenuator coupled to an output of the current-mode mixer; and
   a matching network coupled to an output of the attenuator,
   wherein the input stage, current-mode mixer, attenuator, and the matching network are configured in a series stack; and
   wherein a same bias current is used in the input stage, the current-mode mixer, the attenuator, and the matching network.

2. The RF transmission circuit of claim 1, wherein the attenuator is a variable attenuator.

3. The RF transmission circuit of claim 1, wherein the attenuator is a current-mode attenuator.

4. The RF transmission circuit of claim 1, wherein the matching network comprises an inductive element coupled to an output of the attenuator.

5. The RF transmission circuit of claim 4, wherein the inductive element of the matching network is configured to couple a plurality of transistors of the attenuator to a power supply with a DC voltage drop of less than 20 mV between the power supply and the plurality of transistors of the attenuator.

6. The RF transmission circuit of claim 1, wherein the input stage comprises a plurality of transistors that are configured to operate in a saturation region.

7. The RF transmission circuit of claim 1, wherein the current-mode mixer comprises a plurality of transistors that are configured to be alternately switched between a cutoff region and a triode region.

8. The RF transmission circuit of claim 1, wherein the attenuator comprises a plurality of transistors that are configured to operate in a saturation region.

9. The RF transmission circuit of claim 1, wherein the current-mode mixer is configured to receive a local oscillator (LO) signal that is of rail-to-rail complementary metal oxide semiconductor (CMOS) levels.

10. The RF transmission circuit of claim 1, wherein the attenuator is configured to receive control signals that are of rail-to-rail complementary metal oxide semiconductor (CMOS) levels.

11. The RF transmission circuit of claim 1, wherein the input stage, current-mode mixer, attenuator, and the matching network comprise metal oxide semiconductor (MOS) transistors.

12. The RF transmission circuit of claim 1, wherein the input stage is configured to receive a voltage-mode output from a previous baseband filter stage.

13. The RF transmission circuit of claim 1, wherein the input stage is configured to receive a current-mode output from a previous baseband filter stage.

14. The RF transmission circuit of claim 1, wherein the attenuator is digitally programmable by attenuator settings configured to switch a variable number of parallel current-steering segments of the attenuator.

15. A method of providing a frequency translation, comprising:
   providing an input stage;
   coupling a current-mode mixer to an output of the input stage;
   coupling a current-mode attenuator to an output of the current-mode mixer; and
   coupling a matching network having an inductive element to an output of the current-mode attenuator; and
   using a same bias current in the input stage, the current-mode mixer, the current-mode attenuator, and the matching network,
   wherein the input stage, current-mode mixer, current-mode attenuator, and the matching network are configured in a series stack.

16. The method of claim 15, further comprising coupling, by the matching network, a plurality of transistors of the current-mode attenuator to a power supply with a DC voltage drop of less than 20 mV between the power supply and the plurality of transistors of the current-mode attenuator.

17. The method of claim 15, further comprising:
   operating the plurality of transistors of the input stage in a saturation region;
   alternately switching a plurality of transistors of the current-mode mixer to be operated in a cutoff region and a triode region; and
   operating a plurality of transistors of the attenuator in the saturation region.

18. The method of claim 15, further comprising:
   receiving, by the current-mode mixer, a local oscillator (LO) signal that is of rail-to-rail complementary metal oxide semiconductor (CMOS) levels; and
   receiving, by the current-mode attenuator, control signals that are of rail-to-rail complementary metal oxide semiconductor (CMOS) levels.

19. The method of claim 15, further comprising receiving, by the input stage, a voltage-mode output from a previous baseband filter stage.

20. The method of claim 15, further comprising receiving, by the input stage, a current-mode output from a previous baseband filter stage.

21. A frequency translation circuit comprising:
   an input stage;
   a current-mode mixer coupled to an output of the input stage;

an attenuator coupled to an output of the current-mode mixer; and a matching network coupled to an output of the attenuator, wherein the input stage, current-mode mixer, attenuator, and the matching network are configured in a series stack; and wherein a same bias current is used in the input stage, the current-mode mixer, the attenuator, and the matching network.

22. The frequency translation circuit of claim 21, wherein:

the attenuator is a variable current-mode attenuator; and the matching network comprises an inductive element coupled to an output of the attenuator.

23. The frequency translation circuit of claim 21, wherein the matching network comprises an inductive element coupled to an output of the attenuator.

* * * * *